United States Patent [19]
Chern et al.

[11] Patent Number: 6,124,625
[45] Date of Patent: *Sep. 26, 2000

[54] CHIP DECOUPLING CAPACITOR

[75] Inventors: Wen-Foo Chern; Ward D. Parkinson; Thomas M. Trent; Kevin G. Duesman, all of Boise, Id.

[73] Assignee: Micron Technology, Inc.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/916,184

[22] Filed: Aug. 21, 1997

Related U.S. Application Data

[63] Continuation of application No. 08/655,286, May 15, 1996, abandoned, which is a continuation of application No. 08/341,320, Nov. 17, 1994, abandoned, which is a continuation of application No. 08/100,631, Jul. 29, 1993, abandoned, which is a continuation of application No. 07/970,528, Nov. 2, 1992, Pat. No. 5,266,821, which is a continuation of application No. 07/703,235, May 20, 1991, abandoned, which is a continuation-in-part of application No. 07/529,679, May 28, 1990, abandoned, which is a continuation of application No. 07/200,673, May 31, 1988, abandoned.

[51] Int. Cl.[7] .......................... H01L 29/00; H01L 27/108; H01L 29/93
[52] U.S. Cl. ......................... 257/532; 257/312; 257/596
[58] Field of Search .................................. 257/532, 202, 257/204, 206

[56] References Cited

U.S. PATENT DOCUMENTS

| | | |
|---|---|---|
| 3,460,010 | 8/1969 | Domenico et al. . |
| 3,538,397 | 11/1970 | Davis . |
| 3,769,105 | 10/1973 | Chen et al. . |
| 3,772,097 | 11/1973 | Davis . |
| 4,164,751 | 8/1979 | Tasch, Jr. . |
| 4,266,282 | 5/1981 | Henle et al. . |
| 4,317,686 | 3/1982 | Anand et al. . |
| 4,349,862 | 9/1982 | Bajorek et al. . |
| 4,423,431 | 12/1983 | Sasaki . |
| 4,427,989 | 1/1984 | Anantha et al. . |
| 4,477,736 | 10/1984 | Onishi ..................................... 307/297 |
| 4,493,056 | 1/1985 | Mao . |
| 4,567,542 | 1/1986 | Shimada et al. . |
| 4,577,214 | 3/1986 | Schaper . |
| 4,604,639 | 8/1986 | Kinoshita ................................. 257/296 |
| 4,605,980 | 8/1986 | Hartranft et al. . |
| 4,641,425 | 2/1987 | Dubuisson et al. . |
| 4,654,690 | 3/1987 | Okada et al. . |

(List continued on next page.)

FOREIGN PATENT DOCUMENTS

| | | |
|---|---|---|
| 56-15065 | 2/1981 | Japan . |
| 58-640048 | 4/1983 | Japan ..................................... 257/312 |
| 58-64048 | 4/1983 | Japan . |
| 58-77251 | 5/1983 | Japan . |
| 61-73367 | 4/1986 | Japan ..................................... 257/312 |

OTHER PUBLICATIONS

"On–Chip Decoupling Capacitors for VLSI Gate Array and Master Image Products", IBM Technical Disclosure Bulletin, vol. 31, No. 8 (Jan. 1989) pp. 381–382.

Michael J. Riezenman, "Wanlass's CMOS circuit", IEEE Spectrum, vol. 28, No. 5 (May 1991) p. 44.

Full English Translation of Matsumoto, Japan Kokai 61–73367 (Apr. 15, 1986) pp. 1 to 24.

*Primary Examiner*—Tom Thomas
*Assistant Examiner*—Ori Nadav
*Attorney, Agent, or Firm*—O'Keefe, Egan & Peterman

[57] ABSTRACT

An extensive network of N-channel transistor formed capacitor, with one node tie directly to $V_{CC}$ power bus and the other node directly $V_{SS}$ power bus, is implemented throughout all open space available on the whole silicon chip (memory as well as logic chip), particularly those directly underneath the metal power bus to achieve an on-chip power bus decoupling capacitor with capacitance in excess of 0.001 $\mu$F.

12 Claims, 5 Drawing Sheets

U.S. PATENT DOCUMENTS

| | | |
|---|---|---|
| 4,656,605 | 4/1987 | Clayton . |
| 4,691,304 | 9/1987 | Hori et al. . |
| 4,720,737 | 1/1988 | Shirato . |
| 4,737,830 | 4/1988 | Patel et al. . |
| 4,745,084 | 5/1988 | Rowson et al. .......................... 257/206 |
| 4,777,518 | 10/1988 | Mihara et al. . |
| 4,780,846 | 10/1988 | Tanabe et al. . |
| 4,835,416 | 5/1989 | Miller . |
| 4,937,649 | 6/1990 | Shiba et al. . |
| 5,032,892 | 7/1991 | Chern et al. ............................ 257/312 |
| 5,266,821 | 11/1993 | Chern et al. ............................ 257/312 |
| 5,307,309 | 4/1994 | Protigal et al. . |
| 5,404,042 | 4/1995 | Okumura et al. ....................... 257/204 |

CHIP DECOUPLING CAPACITOR

CROSS-REFERENCE TO RELATED APPLICATIONS

This application is a continuation of application Ser. No. 08/655,286, filed May 15, 1996, which is a continuation of application Ser. No. 08/341,320, filed Nov. 17, 1994, now abandoned, which is a continuation of application Ser. No. 08/100,631 filed Jul. 29, 1993, now abandoned, which is a continuation of U.S. application Ser. No. 07/970,528, filed Nov. 2, 1992, now U.S. Pat. No. 5,266,821, which is a continuation of U.S. application Ser. No. 07/703,235, filed May 20, 1991, now abandoned, which is a continuation-in-part to application Ser. No. 07/529,679, filed May 28, 1990, now abandoned, which is a continuation of application Ser. No. 07/200,673, filed May 31, 1988, now abandoned.

FIELD OF THE INVENTION

This invention relates to semiconductor devices, and more specifically to circuit connections on semiconductor devices and to the reduction of voltage transients on the semiconductor devices.

BACKGROUND OF THE INVENTION

Semiconductor circuit devices, including integrated circuit devices such as DRAMS and SRAMS, switch internal leads and output drivers on and off as a part of their operation.

Such semiconductor devices typically take the form of a semiconductor die. The die is generally attached to a lead frame within a package, by means of fine gold wires, as shown in FIG. 1. These fine gold wires function as lead frame connection wires. The lead frame and die is then encapsulated, in the form of the familiar integrated circuit "chip". The packaged chip is then able to be installed on a circuit board by any number of techniques, such as socketing and soldering.

The gold connection wires, because of their length relative to their diameter, function as inductors. As current through the gold connection wires is alternately switched on or off, voltage spikes occur. In order to reduce the effects of voltage transients, external capacitors have been installed either within the semiconductor package or on a circuit board onto which the semiconductor packages are installed. In either case, the capacitor is on an opposite side of the lead frame connection wire from the semiconductor die. This establishes the circuit shown in FIG. 2. This equivalent circuit represents an inappropriate arrangement for filtering voltage transients from affecting the box, which represents the semiconductor. Therefore, it is desirable to provide capacitance on the other side of the inductor, i.e., the side of the inductor that the device is connected to.

Most semiconductors, including all DRAMS, include capacitors. For example, a 4 Meg DRAM includes over 4 million capacitors each. For the purpose of storing individual bits of information, these capacitors are accessed by connections through access transistors and sense amps, connected through a periphery circuit. The present invention concerns adding filter capacitance to such devices in order to provide protection from voltage transients which may not be afforded by what may be millions of other capacitors on the semiconductor device.

Semiconductor circuit devices are designed with an architecture which places their functional circuitry within a confined area, usually rectangularly shaped. At the perimeter (either outside or inside) of the rectangularly shaped area are a series of contact pads and a substantial amount of chip area which is occupied by conductor busses, but is unoccupied by active circuit devices. Unlike many of the circuit elements on a semiconductor circuit device, filter capacitors need not be built to precise specifications. It is therefore, possible to utilize perimeter areas and portions of semiconductor chip area which form major border areas between active portions of the semiconductor circuit device.

There is a significant advantage in providing that any added circuit elements be on the same side of a chip wafer as other circuit elements, because of manufacturing techniques and tolerances. Conventionally, semiconductor circuit devices are arrayed on one side of a die wafer. It would therefore be advantageous to design a filtering element which would not significantly expand the die area (chip area) required for each die.

There is a certain portion of the die area which is not particularly suitable for active circuitry. This includes chip area occupied by bus lines, which are normally metallization which overlays most or all of the patterned layers which make up the active circuitry on the die.

SUMMARY OF THE INVENTION

In accordance with the present invention, a semiconductor circuit device is formed in which border areas, including perimeter border areas and intermediate border areas, are capacitors. The filter capacitors are in electrical communication with lead frame connection pads, to which the lead frame connection wires are attached. This establishes a filter capacitance in excess of 0.001 $\mu$F on the semiconductor device side of the lead frame connection wires, thereby filtering voltage transients which may be generated by the lead frame connection wires.

The capacitor may be a depletion mode capacitor occupying a space defined by a plurality of conductive lines, such as the bus lines. One of these conductive lines may be connected, as a regulated conductive line, to a voltage regulating circuit.

DETAILED DESCRIPTION OF THE PREFERRED EMBODIMENTS

Figure 1:
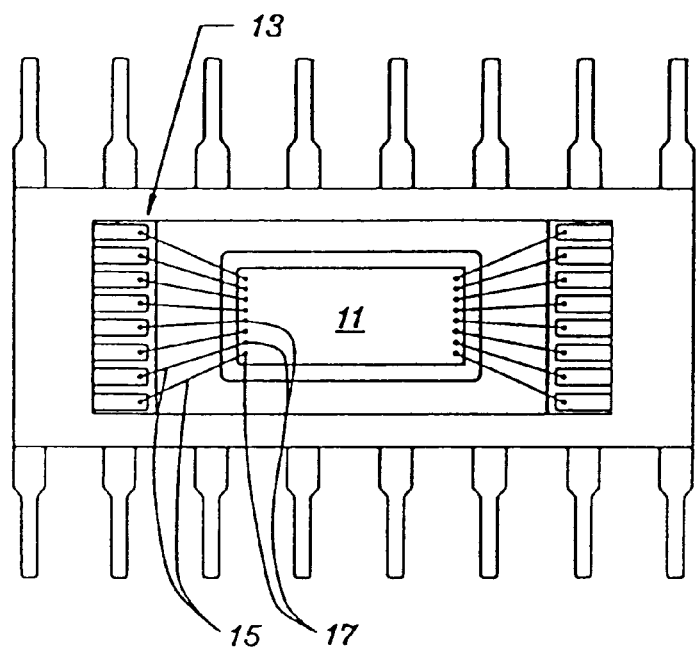
FIG. 1 shows a top view of a semiconductor device attached by pads to the lead frame.
Figure 2:
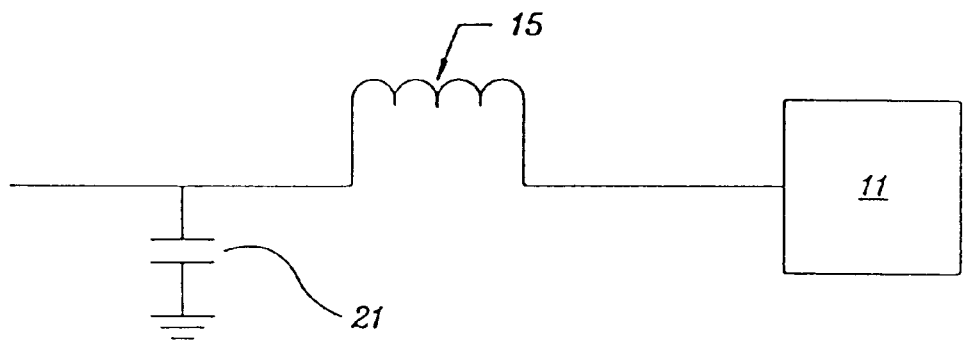
FIG. 2 shows an equivalent circuit of a semiconductor device connected to a lead wire and an off-chip capacitor.
Figure 3:
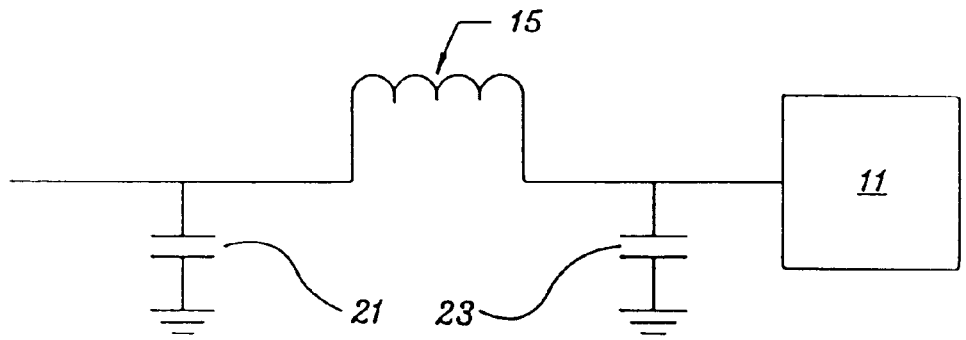
FIG. 3 shows an equivalent circuit of a semiconductor circuit device connected through a lead frame connection wire and having an on-chip decoupling capacitor.

Referring to FIG. 1, a semiconductor device includes a die 11 which is connected to a leadframe 13 by a priority of lead wires 15. The lead wires 15 are attached to the die 11 at pads or contact points 17. The lead wires 15 function as inductors, as schematically shown in FIGS. 2 and 3. While an external capacitor 21 is often provided, appropriate filter capacitance would be located on the die side of the lead wire 15, as schematically shown in Figure at 23.

Figure 4:
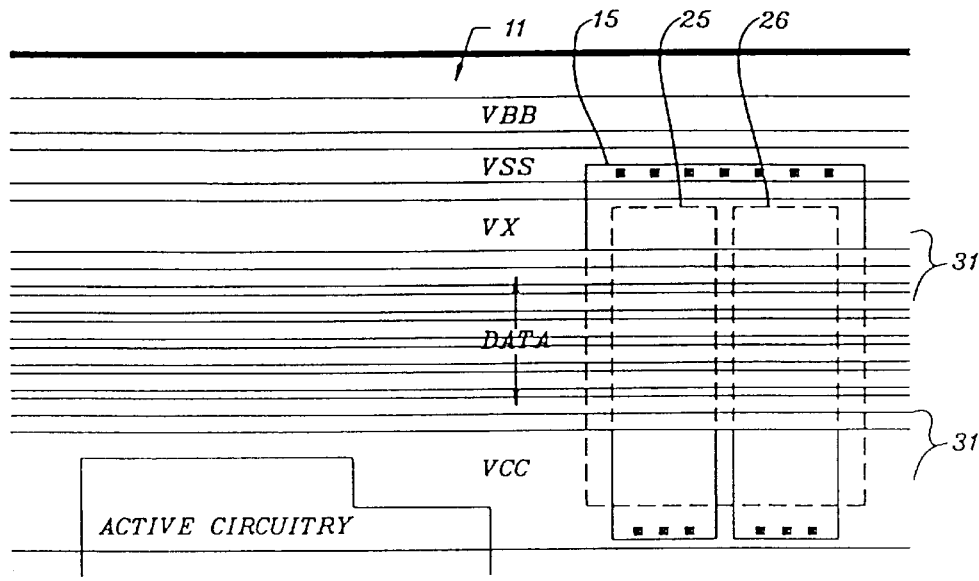
FIG. 4 shows a top view of a semiconductor, which incorporates a decoupling capacitor.

FIG. 4 shows details of one end of the die 11 constructed with the present invention, a pair of capacitors are defined by an active area of the substrate 15 and a polysilicon (poly) layer which is formed into strips 25, 26. The active area 15 is in electrical communication with a first bus line $V_{SS}$. The poly strips 25, 26 are in electrical communication with a second bus line $V_{CC}$. Oxide is used to separate the Poly 25, 26 from the active area 15.

The capacitors defined by the strips 25, 26 are on a location of the circuit die 11 which underlies $V_X$ and $V_{CC}$, as well as other buses 31. The buses 31 (including $V_X$ and $V_{CC}$) are typically metallization layers, and real estate occupied by the buses 31 cannot be used for most active circuitry. This is because active circuitry requires utilization of layers as outputs, which in this case is prevented by the buses 31 which are used for routing signals from the left end to the right end of the chip.

Figure 5:
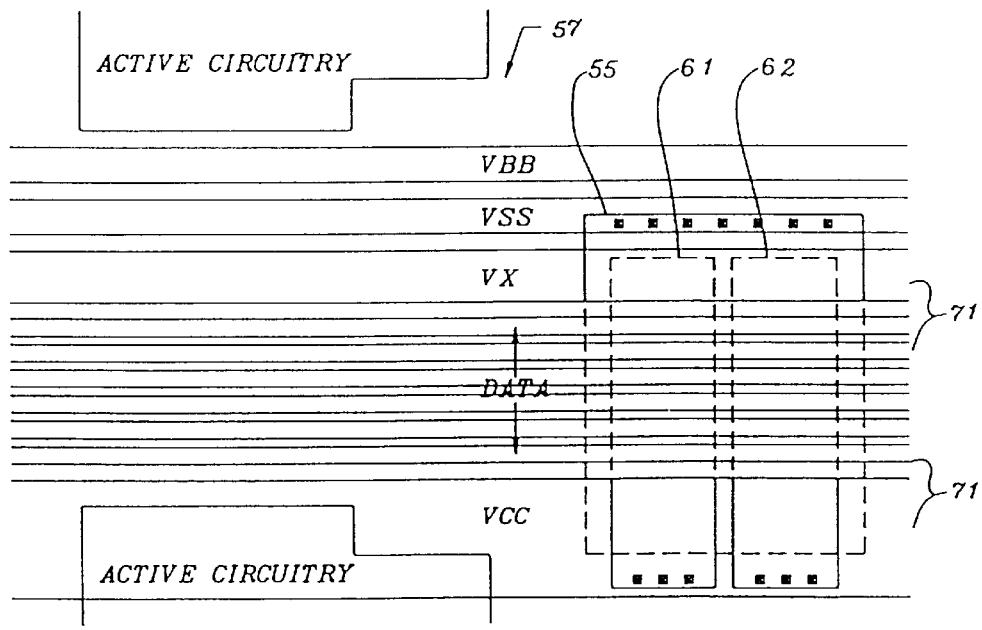
FIG. 5 shows a top view of a semiconductor device, in which a decoupling capacitor is placed along an intermediate boundary area of the chip architecture.

FIG. 5 shows a configuration in which a pair of capacitors are defined by an active substrate area 55 along an intermediate portion of a semiconductor die 57. A plurality of poly strips 61–62, superimposed over the active poly area define a plurality of capacitors. Circuit buses 71 are superimposed over the capacitors 61–62, so that the capacitors 61–62 do not occupy real estate that could be used for most active circuit devices.

The invention has been described in terms of connection to circuit busses which have external connections. It is possible that an additional circuit may be placed between the bus and an external connection. A likely example of such an additional circuit would a voltage regulating circuit. It is possible to connect the capacitor to a bus which extends between such an additional circuit and a main portion of the integrated circuit device.

Figure 6:
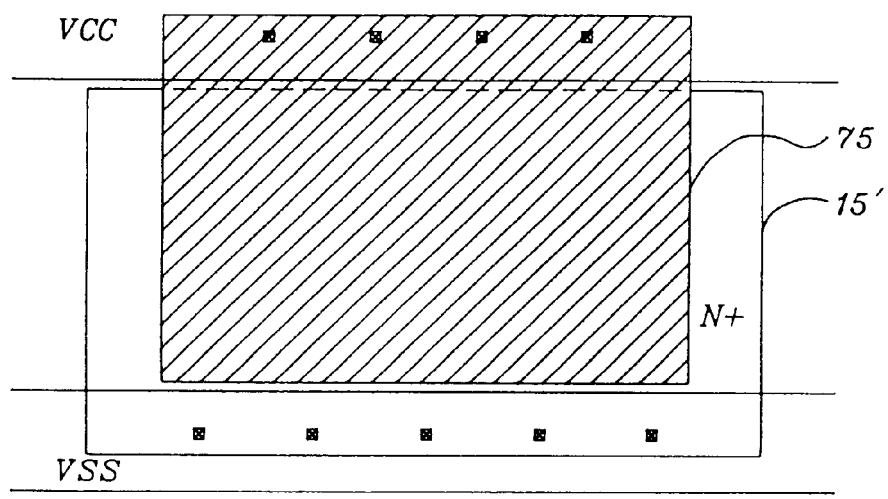
FIGS. 6 and 7 show connection arrangements for N-channel P-channel capacitor, respectively.
Figure 7:
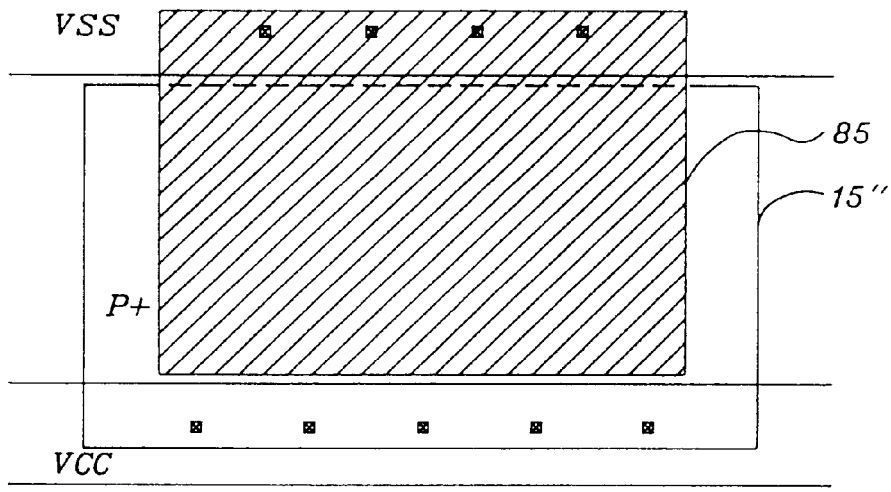
Figure 8:
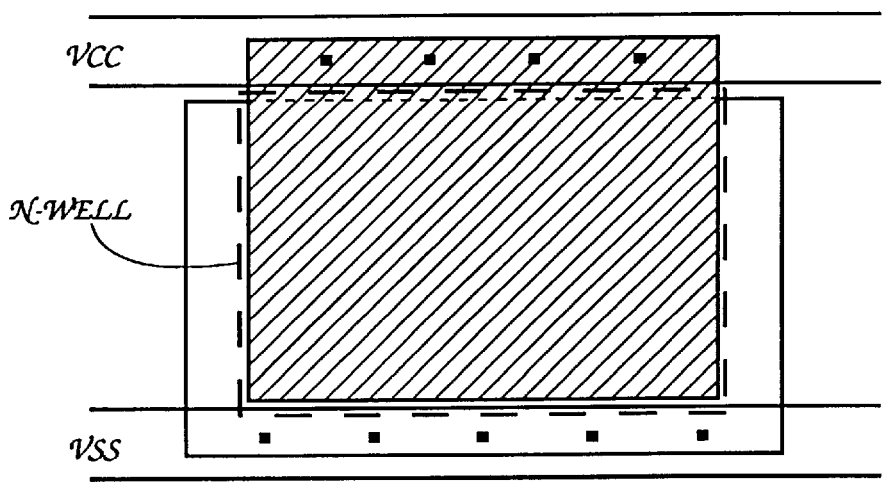
FIGS. 8 and 9 show arrangements for depletion mode capacitors.
Figure 9:
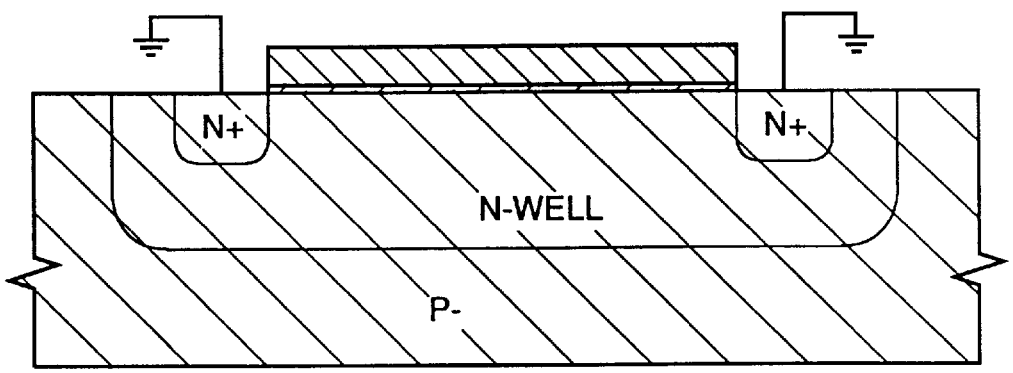

The present embodiment contemplates the use of N channel capacitors, with $V_{SS}$ connected to active area 15' and $V_{CC}$ connected to poly 75. This is shown in FIG. 6. It is possible to construct P channel capacitors, with $V_{CC}$ connected to active area 15" and $V_{SS}$ connected to poly 85. This is shown in FIG. 7. In one embodiment, each of these is an enhancement mode capacitor, which has a preferential voltage polarity. In an alternate embodiment, shown in FIGS. 8 and 9, they may be depletion mode capacitors, which have less preferential voltage polarity. Depletion mode capacitors are defined by an active area of the substrate and a polysilicon layer.

Figure 10:
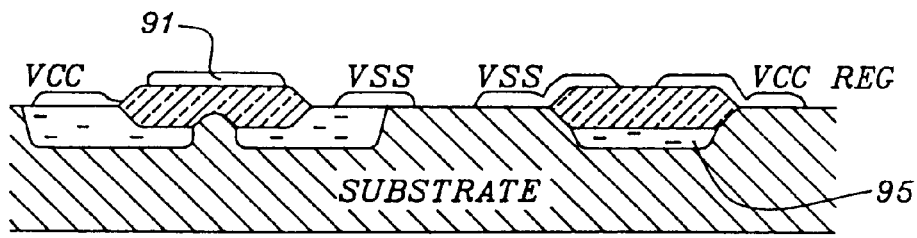
FIG. 10 shows a cross-sectional view of an arrangement in which two capacitors are connected in series in order to increase breakdown voltage.

It may also be the case that two capacitors may be connected in series in order to increase the total breakthrough voltage of the combined capacitors. Enhancement mode capacitors require adjustment for their preferential voltage polarity. This can be accomplished through interconnects or similar means. Depletion mode capacitors, on the other hand, have less preferential voltage polarity. If the capacitors are not polarization sensitive, then the capacitors can have a common poly plate 91 or a common active area 95, as schematically shown in FIG. 10.

Figure 11:
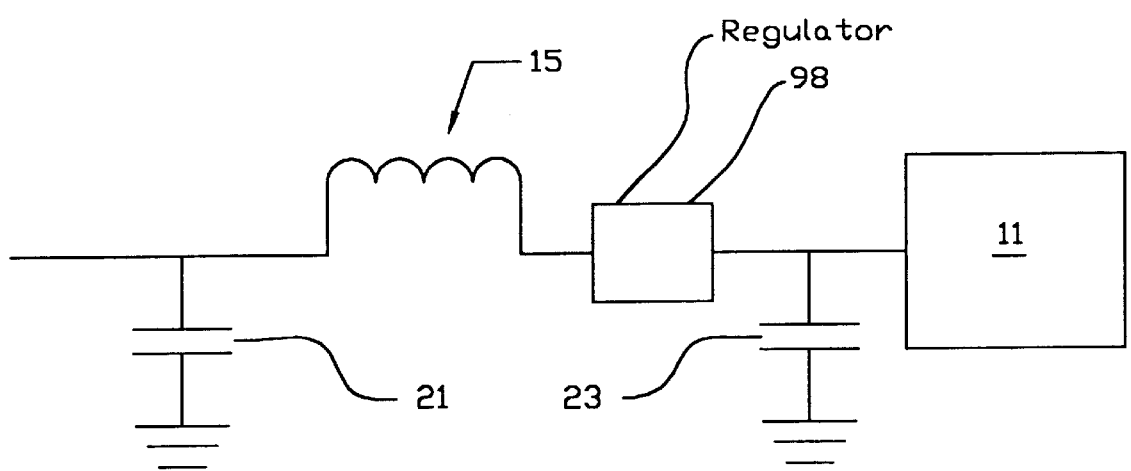
FIG. 11 shows a schematic block diagram representation of semiconductor circuit device having an on-chip regulator.

Referring to FIG. 11, a regulator 96 is on-chip with capacitor 23 and die 11.

We claim:

1. A semiconductor memory device formed on a semiconductor substrate, the device comprising (a) a plurality of active devices;
   (b) a voltage regulator circuit;
   (c) at least one regulated conductive line bus extending along the substrate and coupled between at least one of the active circuit devices and the voltage regulator circuit;
   (d) at least one second conductive line bus extending along the substrate and coupled between at least one of the active circuit devices and external connection points of the semiconductor memory device;
   (e) a capacitor including a first capacitor node, an active area of the substrate included within the first capacitor node, the capacitor also including a polysilicon layer as a second capacitor node, the capacitor being in electrical communication with at least one regulated conductive line bus and being in electrical communication with at least one second conductive line bus,
   (f) the first capacitor node including a first heavily doped region and a second heavily doped region, the first and second heavily doped regions being on opposing sides of the polysilicon layer, wherein one of the at least one regulated conductive line bus or the at least one second conductive line bus makes contact to both of the first and second heavily doped regions;
   (g) the capacitor occupying a space defined by one or more of the at least one second conductive line bus or the at least one regulated conductive line bus; and being located on the substrate in an area which is unoccupied by said active circuit devices; and
   (h) wherein the capacitor forms an on-chip bus decoupling capacitor, thereby adding filter capacitance to the semiconductor circuit device in order to provide protection from voltage transients.

2. The device of claim 1, the first capacitor node being in electrical communication with the at least one regulated conductive line bus and the second capacitor node being in electrical communication with the at least one second conductive line bus.

3. The device of claim 1, the second capacitor node being in electrical communication with the at least one regulated conductive line bus and the first capacitor node being in electrical communication with the at least one second conductive line bus.

4. The device of claim 1, the at least one second conductive line bus being at least one $V_{SS}$ bus.

5. The device of claim 4, the first capacitor node being in electrical communication with the at least one regulated conductive line bus and the second capacitor node being in electrical communication with the at least the at least one $V_{SS}$ bus.

6. The device of claim 4, the second capacitor node being in electrical communication with the at least one regulated conductive line bus and the first capacitor node being in electrical communication with the at least one $V_{SS}$ bus.

7. The device of claim 1, the at least one second conductive line bus being at least one supply bus.

8. A semiconductor memory device formed on a semiconductor substrate, the device comprising (a) a plurality of active devices;
   (b) at least one first supply conductive line bus extending along the substrate and coupled between at least one of the active circuit devices and an external connection point of the semiconductor memory device;
   (c) at least one second supply conductive line bus extending along the substrate and coupled between at least one of the active circuit devices and external connection points of the semiconductor memory;

(d) a capacitor including a first capacitor node, an active area of the substrate included within the first capacitor node, the capacitor also including a polysilicon layer as a second capacitor node, the capacitor being in electrical communication with at least one first supply conductive line bus and being in electrical communication with at least one second conductive line bus, (e) the first capacitor node including a first heavily doped region and a second heavily doped region, the first and second heavily doped regions being on opposing sides of the polysilicon layer, wherein one of the first or second supply conductive line buses makes contact to both of the first and second heavily doped regions;

(f) the capacitor occupying a space defined by one or more of the first or second supply conductive line buses; and being located on the substrate in an area which is unoccupied by said active circuit devices; and (g) wherein the capacitor forms an on-chip bus decoupling capacitor, thereby adding filter capacitance to the semiconductor circuit device in order to provide protection from voltage transients.

9. The device of claim 8, the first capacitor node being in electrical communication with the at least one first supply conductive line bus, the first supply conductive bus being a $V_{CC}$ bus, and the second capacitor node being in electrical communication with the at least one second supply conductive line bus, the second supply being a $V_{SS}$ bus.

10. The circuit device of claim 9, the $V_{CC}$ bus being a regulated $V_{CC}$ bus.

11. The circuit device of claim 8, the second capacitor node being in electrical communication with the at least one first supply conductive line bus, the first supply conductive bus being a $V_{CC}$ bus, and the first capacitor node being in electrical communication with the at least one second supply conductive line bus, the second supply being a $V_{SS}$ bus.

12. The circuit device of claim 9, the $V_{CC}$ bus being a regulated $V_{CC}$ bus.

* * * * *

UNITED STATES PATENT AND TRADEMARK OFFICE
CERTIFICATE OF CORRECTION

PATENT NO.    : 6,124,625
DATED         : September 26, 2000
INVENTOR(S)   : Wen-Fee Chern et al.

It is certified that error appears in the above-identified patent and that said Letters Patent is hereby corrected as shown below:

Column 3,
Line 63, change "regulator 96" to -- regulator 98 --.

Signed and Sealed this

Seventeenth Day of December, 2002

JAMES E. ROGAN
*Director of the United States Patent and Trademark Office*